US010754395B2

(12) United States Patent
Sanchez et al.

(10) Patent No.: US 10,754,395 B2
(45) Date of Patent: Aug. 25, 2020

(54) MULTI-AXIS HINGE TRANSLATION TO ADJUST HOUSING POSITION RELATIVE TO FLEXIBLE DISPLAY POSITION

(71) Applicant: Dell Products L.P., Round Rock, TX (US)

(72) Inventors: Anthony J. Sanchez, Pflugerville, TX (US); Jason Scott Morrison, Chadron, NE (US); Chris A. Torres, San Marcos, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 16/250,834

(22) Filed: Jan. 17, 2019

(65) Prior Publication Data

US 2020/0233466 A1    Jul. 23, 2020

(51) Int. Cl.
*G06F 1/16* (2006.01)
*H05K 5/02* (2006.01)
*H05K 5/00* (2006.01)

(52) U.S. Cl.
CPC .......... *G06F 1/1681* (2013.01); *G06F 1/1618* (2013.01); *H05K 5/0017* (2013.01); *H05K 5/0086* (2013.01); *H05K 5/0226* (2013.01)

(58) Field of Classification Search
CPC .... G06F 1/1681; G06F 1/1652; G06F 1/1615; G06F 1/1624
See application file for complete search history.

(56) References Cited

U.S. PATENT DOCUMENTS

| | | | |
|---|---|---|---|
| 7,558,057 B1 | 7/2009 | Naksen et al. | |
| 8,804,349 B2 | 8/2014 | Lee et al. | |
| 9,164,547 B1 | 10/2015 | Kwon et al. | |
| 9,204,565 B1* | 12/2015 | Lee | E05D 7/00 |
| 9,348,450 B1* | 5/2016 | Kim | G06F 1/1681 |
| 9,557,771 B2* | 1/2017 | Park | G06F 1/1641 |
| 9,603,271 B2 | 3/2017 | Lee | |
| 9,606,583 B2 | 3/2017 | Ahn et al. | |
| 9,684,343 B2* | 6/2017 | Tazbaz | G06F 1/1618 |
| 9,710,033 B2 | 7/2017 | Yamazaki et al. | |
| 9,760,126 B2* | 9/2017 | Shin | G06F 1/1652 |
| 9,848,502 B1 | 12/2017 | Chu | |
| 9,870,031 B2 | 1/2018 | Hsu et al. | |
| 9,874,048 B1* | 1/2018 | Hsu | E05D 11/1028 |
| 9,874,906 B1* | 1/2018 | Hsu | G06F 1/1681 |
| 9,992,888 B2* | 6/2018 | Moon | G06F 1/1681 |
| 10,082,839 B1* | 9/2018 | Turchin | G06F 1/1652 |
| 10,104,790 B2* | 10/2018 | Lee | E05D 11/0054 |
| 10,143,098 B1* | 11/2018 | Lee | G06F 1/1652 |

(Continued)

*Primary Examiner* — Abhishek M Rathod
*Assistant Examiner* — Keith DePew
(74) *Attorney, Agent, or Firm* — Zagorin Cave LLP; Robert W. Holland

(57) ABSTRACT

A portable information handling system rotationally couples first and second housing portions with a multi-axis hinge and disposes a flexible display over the first and second housing portions supported by a first sliding support over the first housing portion and a second sliding support over the second housing portion. An actuator interfaced with the multi-axis hinge translates hinge axis rotation into lateral movement of the sliding supports to adjust sliding support positions relative to flexible display positions as the flexible display folds around the hinge inner circumference.

16 Claims, 5 Drawing Sheets

(56) References Cited

U.S. PATENT DOCUMENTS

| | | | |
|---|---|---|---|
| 10,231,347 B2* | 3/2019 | Seo | H04M 1/0268 |
| 10,244,641 B2* | 3/2019 | Seo | G06F 1/1641 |
| 10,274,996 B2* | 4/2019 | Lin | G06F 1/1641 |
| 10,306,783 B2* | 5/2019 | Seo | H04M 1/0216 |
| 10,327,346 B2* | 6/2019 | Zhang | H05K 5/0017 |
| 10,365,691 B2* | 7/2019 | Bae | G06F 1/1652 |
| 10,383,239 B2* | 8/2019 | Lee | H05K 5/0217 |
| 2012/0264489 A1 | 10/2012 | Choi | |
| 2012/0307472 A1 | 12/2012 | Bohn | |
| 2013/0286553 A1 | 10/2013 | Vanska | |
| 2014/0042293 A1 | 2/2014 | Mok | |
| 2014/0111954 A1* | 4/2014 | Lee | G06F 1/1641 361/749 |
| 2014/0123436 A1* | 5/2014 | Griffin | H04M 1/0216 16/221 |
| 2014/0226275 A1 | 8/2014 | Ko | |
| 2014/0328041 A1 | 11/2014 | Rothkopf | |
| 2015/0062525 A1 | 3/2015 | Hirakata | |
| 2015/0233162 A1* | 8/2015 | Lee | H04M 1/02 16/223 |
| 2015/0277506 A1 | 10/2015 | Cheah et al. | |
| 2015/0366089 A1* | 12/2015 | Park | G06F 1/1641 361/679.01 |
| 2016/0132076 A1 | 5/2016 | Bitz et al. | |
| 2016/0227645 A1* | 8/2016 | Hampton | G06F 1/1601 |
| 2017/0139442 A1* | 5/2017 | Yoshizumi | H04M 1/0268 |
| 2017/0307929 A1* | 10/2017 | Nakazawa | G02F 1/133305 |
| 2018/0095502 A1* | 4/2018 | Yamazaki | F16M 11/38 |
| 2018/0324964 A1* | 11/2018 | Yoo | G06F 1/1616 |

* cited by examiner

MULTI-AXIS HINGE TRANSLATION TO ADJUST HOUSING POSITION RELATIVE TO FLEXIBLE DISPLAY POSITION

BACKGROUND OF THE INVENTION

Field of the Invention

The present invention relates in general to the field of information handling system display integration, and more particularly to a multi-axis translation to adjust housing position relative to flexible display position.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems are built in portable housings to support mobile operations free from external cables. For example, portable information handling systems typically integrate processing components, a battery and a touchscreen display that presents information as visual images and accepts touches as inputs. Tablet portable information handling systems generally dispose processing components and the battery in a planar housing covered by the touchscreen display. Convertible information handling systems typically have separate planar housing portions rotationally coupled by a hinge to rotate between a closed position and various open positions that accept inputs, such as a clamshell and tablet position. Conventional convertible information handling systems integrate the touchscreen display in one planar housing portion and a keyboard in the other planar housing portion so that an end user can type inputs into the information handling system. Some convertible information handling systems rotate housing portions 360 degrees relative to each other to a tablet position that exposes the touchscreen display on one side and hides the keyboard underneath on the other side.

One type of touchscreen display used in portable information handling systems is an organic light emitting diode (OLED) display, which illuminates colors at pixels by electrical stimulation of an organic material. OLED displays provide a thinner solution than conventional liquid crystal displays (LCDs), which rely upon a backlight to illuminate an image. OLED displays are typically built by disposing a flexible OLED film over a substrate. In a conventional tablet or convertible system, OLED display films are typically disposed over a glass or other stiff substrate to provide a firm surface against which an end user may make touch inputs. Some convertible information handling systems include an OLED display over both rotationally coupled housing portions, in effect replacing the keyboard with a touchscreen display. In such systems, when the housing portions rotate to a clamshell configuration, a keyboard presented at the display accepts typed inputs. When the system rotates 180 degrees to a flat configuration, both display surfaces are available for presenting visual images as tablet. An advantage of this configuration is that a larger tablet display area is available for viewing information, while a closed configuration improves portability. A disadvantage of this configuration is that a seam exists between the two display areas where the hinge rotationally couples the housing portions to each other.

Since OLED films are flexible, mounting an OLED film on a flexible substrate, such as a plastic substrate, allows folding of a display with a hinge about an intersection of housing portions. With a POLED flexible display, the display is disposed over both rotationally coupled housing portions to fold with hinge rotation between closed and open positions. The closed position protects the display and offers reduced size for improved portability. The open position offers a contiguous display area across both housing portions for improved visual image presentation. A difficulty with incorporation of a flexible OLED display in a flexible housing is that the rotation about the hinge has a different degree of motion for the display on the inner circumference of the motion and the housing that supports the display, which resides in a different plane of travel. The "gap" in relative motion has to be accommodated or the flexible display will have waviness introduced with associated poor electrical and optical damage, including likely physical damage.

Starting from a flat configuration, as housing portions are folded over top of the display to a folded configuration that encloses and protects the display, the display has a fixed length that, in effect, results in the ends of the display extending past the ends of the housing in the folded configuration. Conventional multi-axis hinges provide some curvature about the fold axis to reduce stress on the flexible display material at the fold, however, the thicker the flexible display and hinge geometry the more relative motion of the housing portions to the display. Conventional multi-axis hinges have a fixed rotational motion and length, which can result in compression of the flexible display during relative motion. In addition, flexible displays have a stiffness that acts as a spring when folded, providing a bias towards a flat configuration.

SUMMARY OF THE INVENTION

Therefore, a need has arisen for a system and method which manages housing position relative to a flexible display during transition between flat and folded configurations.

In accordance with the present invention, a system and method are provided which substantially reduce the disadvantages and problems associated with previous methods and systems for managing housing position relative to a flexible display during transition between flat and folded configurations. An actuator translates hinge rotation into lateral movement of a sliding support under the display to adjust the sliding support position to changes in relative length of the flexible display as the flexible display folds about the hinge.

More specifically, a portable information handling system processes information with components disposed in first and second rotationally coupled housing portions and covered by a flexible display. A hinge assembly coupled between the housing portions rotates the housing portions between flat and folded configurations with the flexible display folding at the hinge location in the folded configuration. A sliding support disposed at each housing portion under the flexible display slides relative to the housing to support the display as the relative length of the flexible display and housing changes during folding, such as due to the flexible display location on an inner circumference of the housing in the folded configuration. An actuator translates hinge rotation to a lateral sliding movement of the sliding support to maintain the sliding support position relative to the flexible display. For example, a threaded axle on each side of the display engages a bracket to move the bracket as the axle rotates. The bracket translates motion parallel to the axle through a lever arm into lateral motion towards and away from the hinge, which is applied to the sliding support.

The present invention provides a number of important technical advantages. One example of an important technical advantage is that rotationally coupled housing portions adjust laterally with rotational orientation to match positions relative to a flexible display. A threaded relationship that drives an L-shaped linkage provides precise planar motion of housing portions relative to the flexible display as rotational orientation changes to prevent compression of the flexible display. A spring loaded with the drive system biases the flexible display towards a folded configuration to offset flexible display bias towards a flat configuration. The threaded relationship of the drive system has a leadscrew with multiple starts to generate increased cam contact that reduces wear and backlash for a robust system that will withstand repeated rotational movements without failure.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A portable information handling system supports a flexible display folded across a hinge by adjusting the hinge size based upon hinge rotational position. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
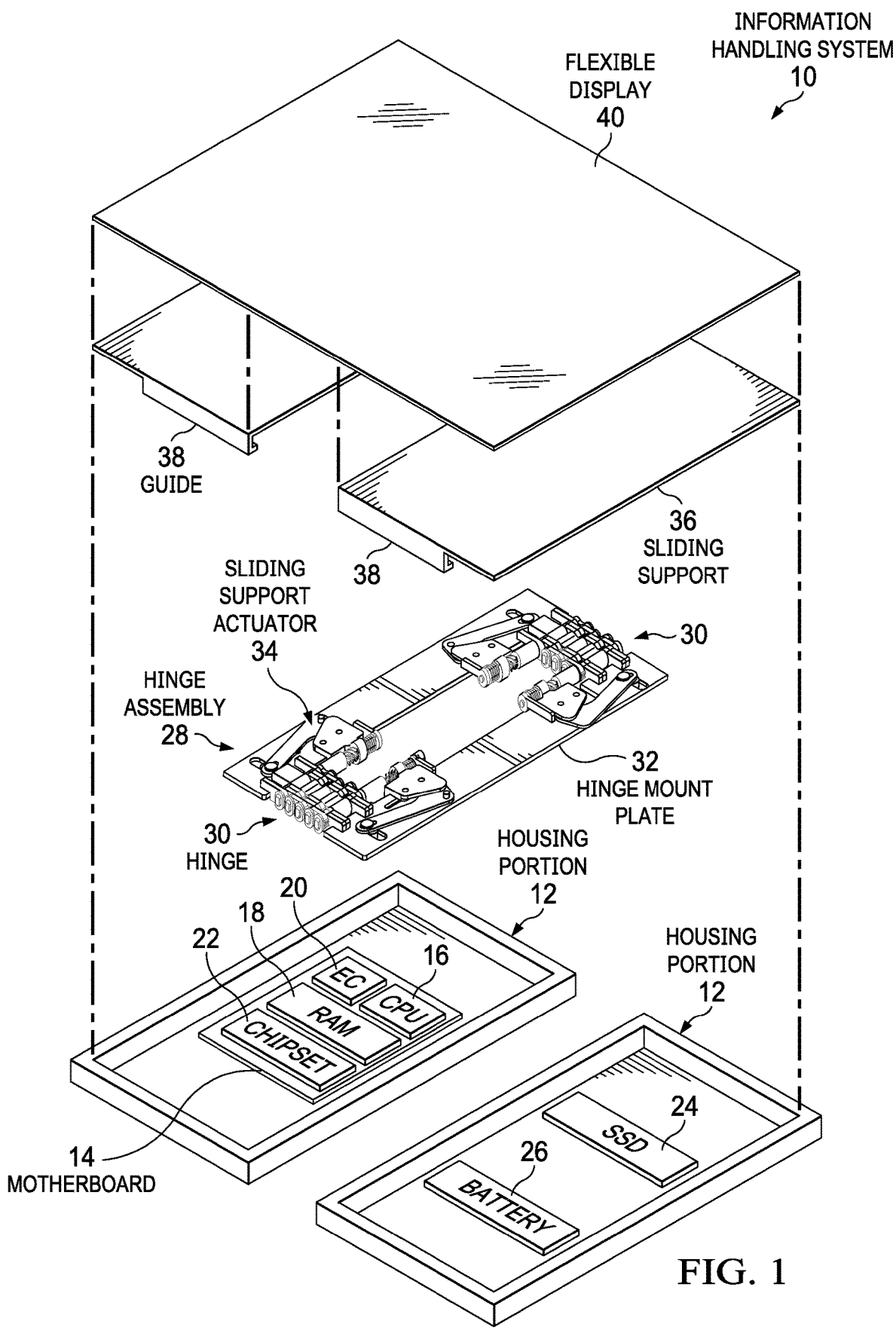
FIG. 1 depicts an exploded view of a portable information handling system having a flexible display disposed over plural housing portions with sliding supports.

Referring now to FIG. 1, an exploded view depicts a portable information handling system 10 having a flexible display 40 disposed over plural housing portions 12 with sliding supports 36. Portable information handling system 10 processes information with components disposed in portable housing portions 12. In the example embodiment, a motherboard 14 interfaces processing components that cooperate to process information. For instance, a central processing unit (CPU) 16 executes instructions to process information stored in a random access memory (RAM) 18, such as instructions of an operating system and applications. An embedded controller 20 manages power and interactions with input/output devices, such as touches at a touchscreen integrated in flexible display 40. A chipset 22 manages operation of CPU 16, such as providing power, clock and memory access functions. In the example embodiment, motherboard 14 fits into one of housing portions 12 while other components, such as a solid state drive (SSD) 24 and battery 26, fit into the other housing portion 12. In various embodiments, components may be dispersed between housing portions 12 in various ways, such as to minimize system height. In addition to the components depicted in the example embodiment, other types of components may be included, such as to support graphics processing, wireless communication, peripheral device interfaces, etc . . . .

Housing portions 12 rotationally couple to each other with a hinge assembly 28 that couples to each housing portion 12 between the housing portions 12. In the example embodiment, hinge assembly 28 has first and second hinges 30 coupled to each other at opposing ends of opposing hinge mount plates 32. Each hinge 30 is a multi-axis hinge that rotates housing portions 12 about an inner radius as described further below. In the example embodiment, hinge assembly 28 rotates housing portions 12 for 180 degrees between a flat configuration as depicted and a folded configuration having housing portions 12 vertically aligned. In alternative embodiments, hinge assembly 28 may rotate for 360 degrees to vertically align housing portions 12 in opposing order. The example embodiment rotates 180 degrees from the flat configuration to fold flexible display 40 along an inner circumference of the folded configuration. A folded configuration with flexible display 40 located at the inner circumference protects the display surface during storage and transportation of portable information handling system 10. In an alternate embodiment having flexible display 40 exposed at an outer circumference in the folded configuration, the display presentation remains visible in the stored configuration.

To manage folding of flexible display 40, a sliding support 36 is disposed between flexible display 40 and the components in each housing portion 12. Sliding support 36 is a solid surface, such as metal or plastic, that provides physical support under flexible display 40 during touch interactions by an end user. Flexible display 40 is, for instance, a plastic substrate organic light emitting diode display (POLED) that folds in response to rotation of hinge assembly 28. To limit the risk of damage to the POLED material, hinge assembly 28 folds to have a radius that does not place excessive compressive forces on flexible display 40. The folding radius is defined by the number and size of rotating hinge elements in each hinge 30, as explained in greater depth below. During folding of flexible display 40, the inner radius of portable information handling system 10 has a smaller circumference than that of hinge assembly 28 and housing portions 12. The effect of the different folding radii is to have a relative motion of flexible display 40 outward compared with housing portions 12 as portable information handling system 10 folds. To offset this motion and ensure that flexible display 40 has support along its entire length, hinge assembly 28, in effect, extends its length by laterally moving sliding supports 36 away from hinges 30 as the hinges rotate from the flat to the folded configuration. Similarly, as hinges 30 rotate from the folded to the flat configuration, sliding supports 36 slide laterally inward towards hinges 30. Coordinated motion of sliding supports 36 responsive to hinge 30 rotation provides support under flexible display 40 throughout the transition of portable information handling system 10 between the flat and folded configurations.

In the example embodiment, an actuator 34 interfaces hinge assembly 28 and sliding supports 36 to coordinate lateral sliding movement of sliding supports 36 with changes to the relative length of flexible display 40 that results from hinge 30 rotation. Each sliding support 36 has opposing guides 38 that extend downward to engage with hinge mount plate 32 of hinge assembly 28. Actuator 34 couples to sliding support 36 and hinge mount plate 32 to coordinate relative positioning of sliding support 36 to hinge assembly 28 based upon rotational orientation of housing portions 12. For example, an actuator 34 engages with each hinge 30 at each hinge mount plate 32 to translate rotational movement of each hinge 30 into lateral movement of sliding support 26.

Figure 2:
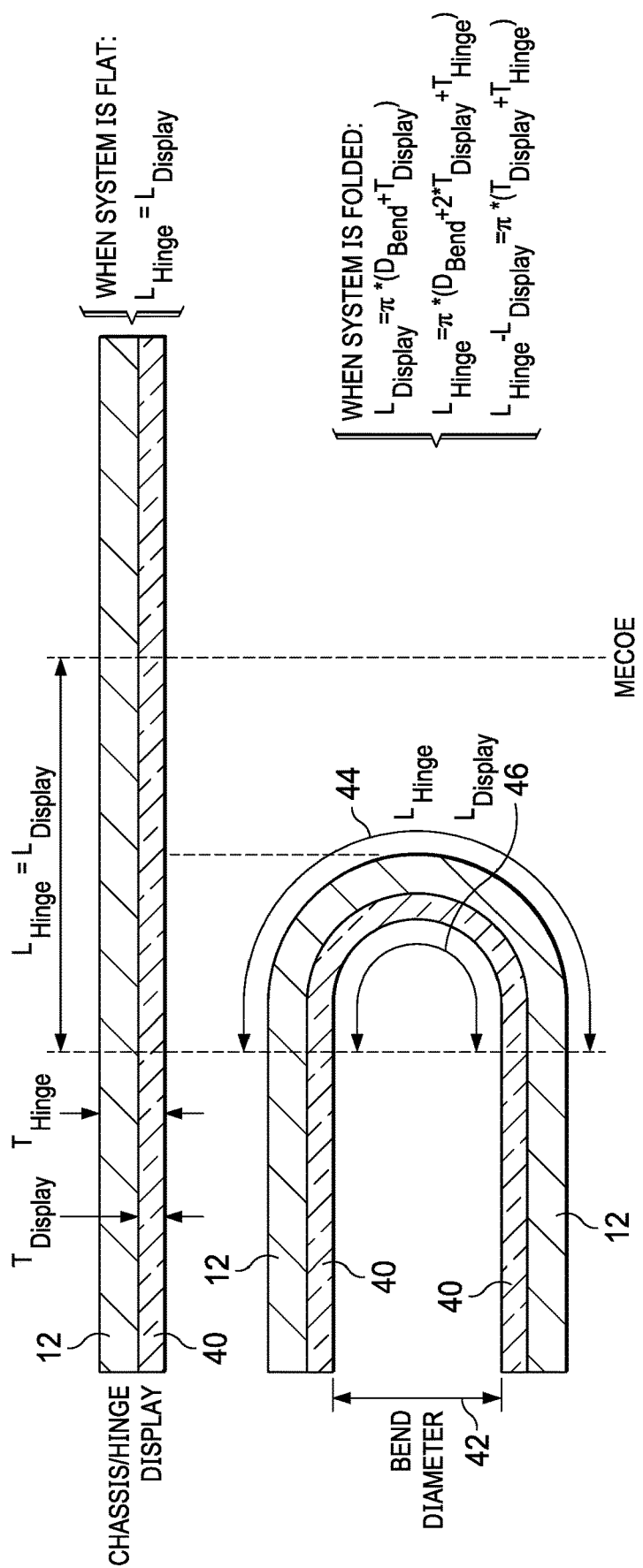
FIG. 2 depicts an example of flexible display and housing relative positions at flat and folded configurations.

Referring now to FIG. 2, an example is depicted of flexible display 40 and housing 12 relative positions at flat and folded configurations. In the flat configuration, the length of housing 12 equals the length of the display 40. To fold portable information handling system 10 without placing undue stress on flexible display 40, a bend diameter 42 is defined by hinge assembly 28, such as based upon flexibility constraints of flexible display 40. Bend diameter 42 in turn defines a relative motion of housing 12 and flexible display 40 as housing 12 folds with flexible display 40 on the inner circumference 46. In the folded configuration, the relative length of flexible display 40 to housing 12 increases by the difference of the diameter of the housing at the outer circumference 44 and the diameter of the display at the inner circumference as shown by the depicted formulas. To maintain support of flexible display 40 during folding, the length of housing 12, which is in effect the length of hinge assembly 28, increases as rotational orientation increases in proportion to the change of length of housing 12 and flexible display 40. In an alternative embodiment where flexible display 40 folds to an outer circumference, a similar but opposite relationship exists so that housing 12 retracts in the folded configuration. In another embodiment that supports 360 degrees of rotational movement, the total relative movement of housing 12 and flexible display 40 between opposing folding configurations includes the bend diameter rotation performed twice.

Figure 3:
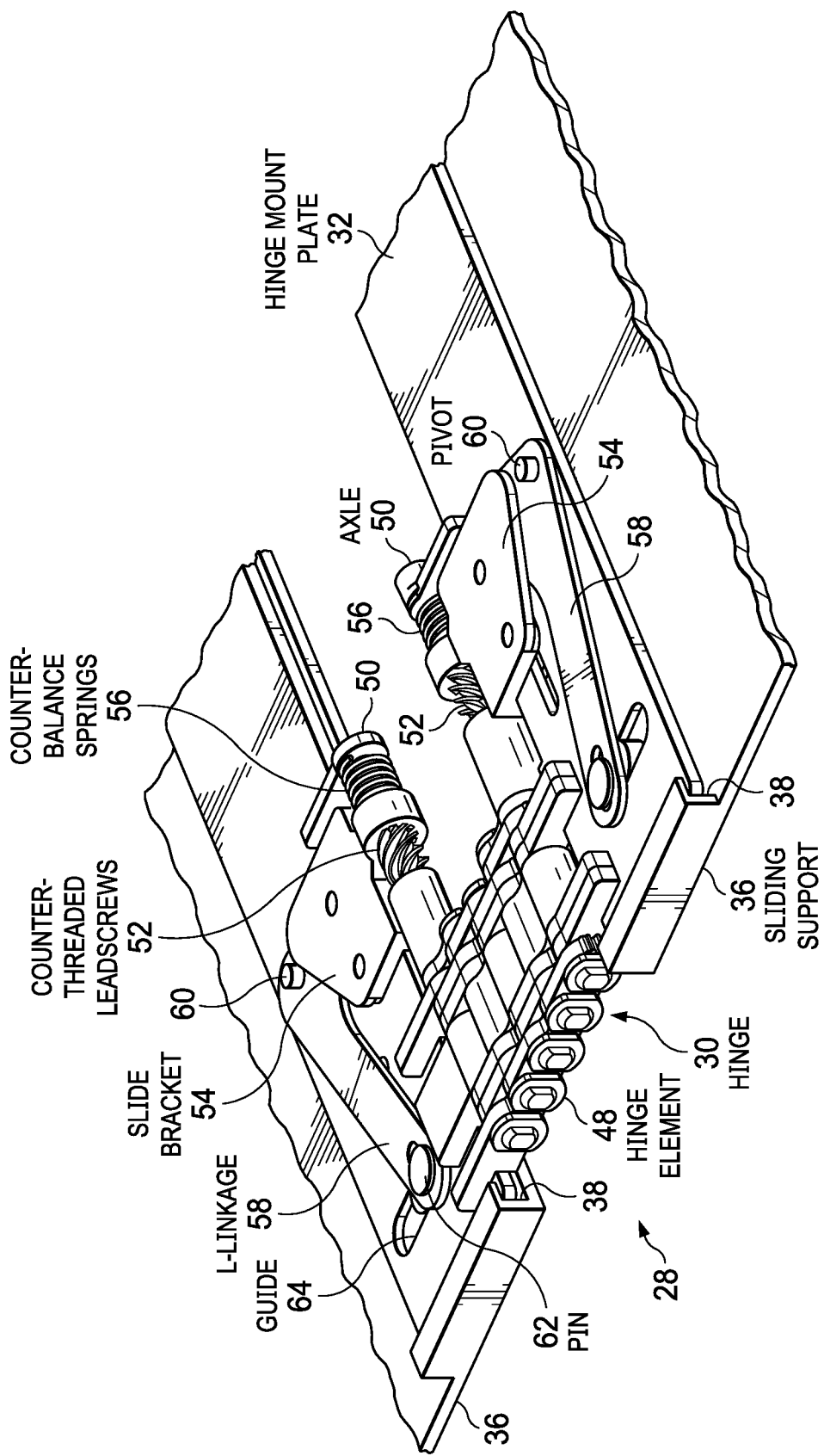
FIG. 3 depicts a lower side perspective view of a hinge assembly and actuator configured to adjust a sliding support in response to hinge rotation.

Referring now to FIG. 3, a lower side perspective view depicts a hinge assembly 28 and actuator 34 configured to adjust a sliding support 36 in response to hinge 30 rotation. In the example embodiment, hinge 30 rotates with a coordinated rotational interface defined between five hinge elements 48, such as a geared interface. The bend radius of hinge 30 is defined about the central hinge element 48 based upon the size and number of additional hinge elements 48. As the outer hinge elements rotate in response to hinge 30 rotation, axles 50 extending from each outer hinge element 48 rotate so that counter-threaded leadscrews 52 integrated in each axle 50 rotates. The threads of counter-threaded leadscrews 52 engage with a bracket 54 to impart motion on bracket 54 in response to rotation of hinge 30. Threads of counter-threaded leadscrews 52 have a high pitch so that multiple starts of the threads engage with threads in bracket 54 around the inner circumference of bracket 54. By having multiple starts of the thread engagement, axle 52 rotation generates a large amount of cam contact to reduce thread wear and backlash.

In the example embodiment, from the depicted flat configuration as rotation about hinge 30 is translated through axles 50, brackets 54 are pulled towards hinge 30. A counter balance spring 56 biases bracket 54 towards hinge 30 to aid this movement and create some resistance against movement of bracket 54 away from hinge 30. The bias provided by counter-balance spring 56 counteracts a tendency for flexible display 40 to return to a flat configuration as folding places strain on the plastic substrate, which is biased to a flat configuration. By biasing flexible display 40 towards a folded configuration, counter balance springe 56 reduces the amount of holding friction hinge 30 has to integrate to hold the housing in set configuration, thus reducing hinge size and expense.

As bracket 54 moves along axle 50 towards hinge 30, the movement is translated by a linkage 58 about a pivot 60 to a pin 62 extending up from sliding support 36 through a guide 64. Motion of bracket 54 parallel to axle 50 is thus translated in a transverse direction into lateral motion of sliding support 36 away from hinge 30. Linkage 58 has a perpendicular spaced relationship between pivot 60 and guide 64 to rotate about pivot 60 as a fixed position relative to hinge mount plate 32, thus imparting transverse motion through pin 62. Guides 38 interact with hinge mount plate 32 to maintain sliding support 36 in position relative to flexible display 40 and slide in a direction perpendicular to hinge 30. In effect, sliding support 36 operates to extend the length of hinge assembly 28 in proportion to rotational orientation. As hinge 30 rotates from a folded to a flat orientation, an opposite motion is imparted to bracket 54 that translates through linkage 58 to retract sliding support 36 towards hinge 30.

In the example embodiment of FIG. 3, flexible display 40 is supported by sliding support 36 on the opposite side of hinge mount plate 32 to fold from the flat configuration to a folded configuration having flexible display 40 on the inner circumference. In an alternative embodiment, hinge 30 may rotate in an opposite direction to bring brackets 54 together at an inner circumference and have flexible display 40 at an outer circumference. In such an embodiment, bracket 54 moves away from hinge 30 to pull sliding support 36 inward.

Supporting such an opposite rotation may be done by changing the relative position of pin 62 within guide 64 and adjusting the position of bracket 54 on counter-threaded leadscrews 52. In one example embodiment, 360 degrees of motion may be supported with adjusted orientations of brackets 54, linkage 58, pin 62 and guide 64.

Figure 4:
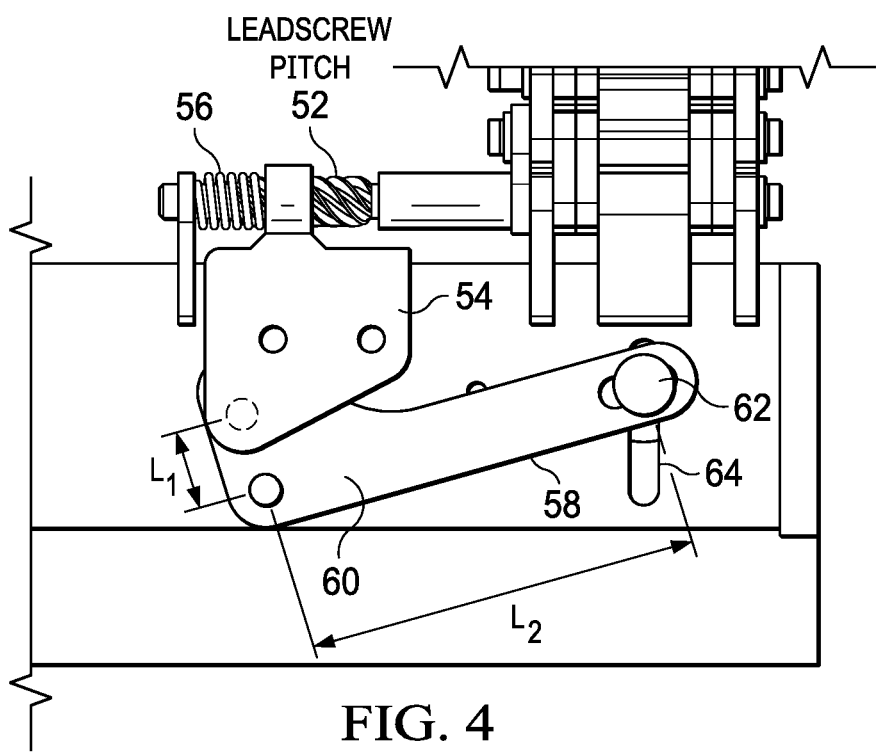
FIG. 4 depicts a bottom view of an actuator that translates rotation of a hinge axle into lateral movement of a sliding support.

Referring now to FIG. 4, a bottom view depicts an actuator 34 that translates rotation of a hinge axle 50 into lateral movement of a sliding support 36. The example embodiment illustrates one example of proportional relationships between rotation of hinge 30 and motion of sliding support 36. The pitch of threads formed in leadscrew 52 are selected to provide sufficient translation into motion of bracket 54 based, for example, on the amount of rotation imparted on the outer most hinge element 48 to hinge axle 50. The pitch of threads of leadscrew 52 cannot have too high of a value or the threads may lock during rotation, such as from excess friction. In the example embodiment, an 8 mm lead is formed on a 3.3 mm screw diameter with each of the five hinge elements 48 rotating 36 degrees to achieve a total of 180 degrees of hinge 30 rotation. Thus, approximately 0.8 mm of travel is generated in bracket 54 with 180 degrees of housing rotation.

Using the example pitch and resulting bracket 54 motion, a ratio of 4.15 defined for the distance L1 and L2 converts the 0.8 mm of motion by bracket 54 into the transverse direction of 3.3 mm for lateral motion of sliding supports 36. For instance, a value for L1 of 6.5 mm and a value for L2 of 27 mm provides the ratio of 4.15 so that each sliding support 36 will move 3.3 mm for a total extension of the effective hinge length by 6.6 mm from the flat to the folded configuration.

Figure 5:
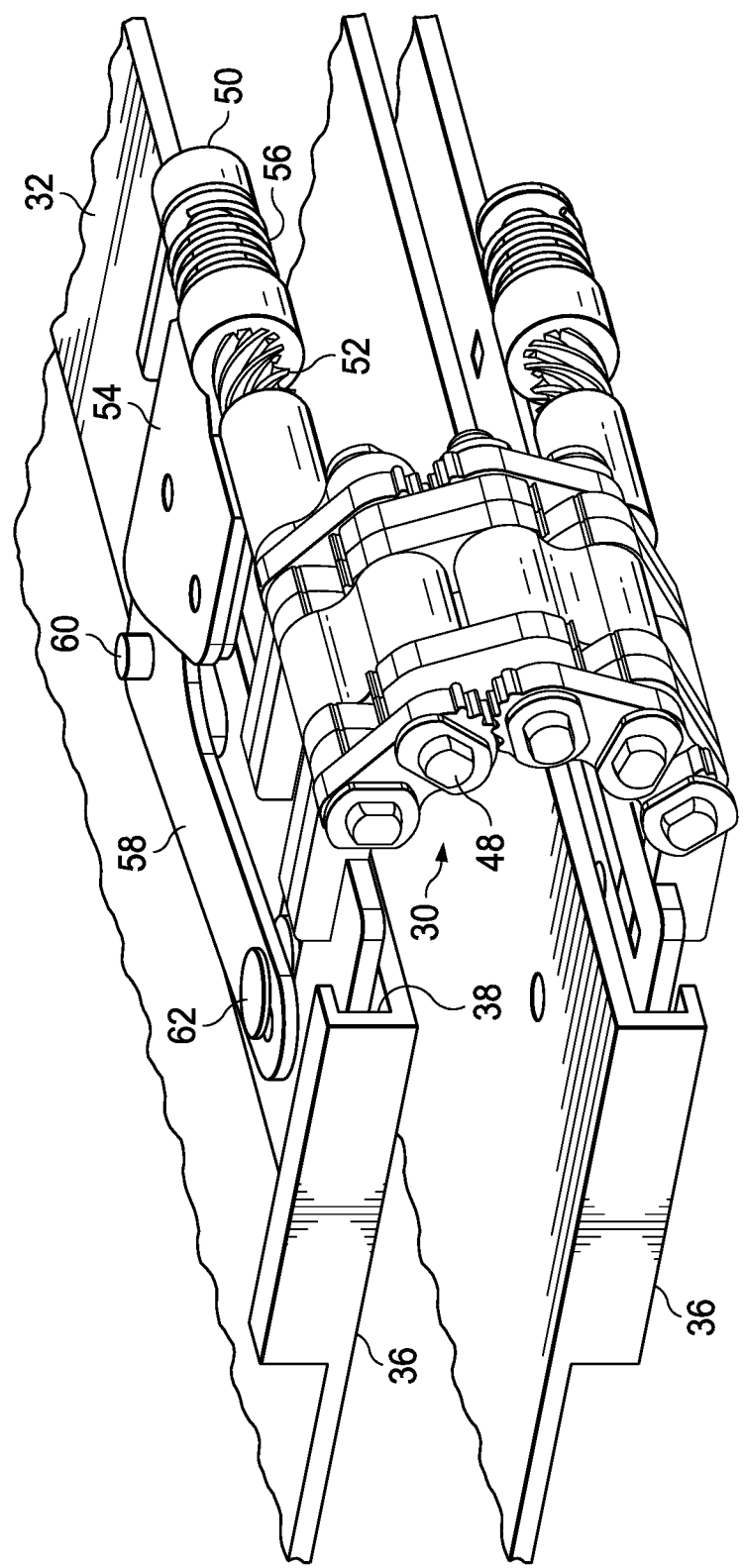
FIG. 5 depicts a bottom view of the actuator having translated hinge motion to a folded configuration to adjust the sliding support position.

Referring now to FIG. 5, a bottom view depicts the actuator 34 having translated hinge motion to a folded configuration to adjust the sliding support 36 position. As illustrated by FIG. 5, rotation to the folded configuration has slid sliding support 36 relative to hinge mount plate 32 within guide 38 to extend sliding support 36. The extension of sliding support 36 corresponds to the relative increased length of flexible display 40 due to its smaller circumference on the inner side of the folded configuration.

Although the present invention has been described in detail, it should be understood that various changes, substitutions and alterations can be made hereto without departing from the spirit and scope of the invention as defined by the appended claims.

What is claimed is:

1. A portable information handling system comprising:
   first and second housing portions;
   components disposed in the first and second housing portions, the components cooperating to process information;
   a multi-axis hinge rotationally coupling the first and second housing portions to rotate between flat and folded configurations;
   a flexible display disposed over the first and second housing portions and the processing components, the flexible display interfaced with the processing components to present the information as visual images;
   first and second display supports disposed between the display and components; and
   first and second actuators interfacing the multi-axis hinge and the first and second display supports, the first actuator translating rotation of the multi-axis hinge into lateral movement of the first display support relative to the multi-axis hinge, the second actuator translating rotation of the multi-axis hinge into lateral movement of the second display support relative to the multi-axis hinge;
   wherein each actuator further comprises:
   a hinge axle terminating in a threaded portion and rotating with rotation of the multi-axis hinge;
   a bracket having an opening with a threaded inner circumference engaged with the threaded portion, the bracket moving along the hinge axle in response to rotation of the hinge axle; and
   a lever interfacing the bracket and one of the display supports, the lever translating bracket movement along the hinge axle into lateral movement of the one of the display supports perpendicular to the hinge axle.

2. The portable information handling system of claim 1 further comprising a spring disposed on the hinge axle and biasing the bracket towards the multi-axis hinge.

3. The portable information handling system of claim 1 wherein the threaded portion engages the bracket with multiple starts.

4. The portable information handling system of claim 1 wherein the threaded portion pulls the bracket towards the multi-axis hinge upon rotation from the flat to the folded configuration, the lever extending the one of the display supports away from the multi-axis hinge in the folded configuration, the flexible display disposed on the inner circumference of the folded configuration.

5. The portable information handling system of claim 1 wherein the threaded portion pulls the bracket away from the multi-axis hinge upon rotation from the flat to the folded configuration, the lever extending the one of the display supports away from the multi-axis hinge in the flat configuration, the flexible display disposed on the outer circumference of the folded configuration.

6. The portable information handling system of claim 1 wherein the flexible display comprises a plastic substrate organic light emitting diode display.

7. The portable information handling system of claim 1 wherein the lever further comprises:
   a first arm coupled to the sliding bracket to move with the bracket upon rotation of the hinge axle;
   a pivot point fixed relative to the multi-axis hinge; and
   a second arm extending from the pivot substantially perpendicular to the first arm and terminating at a coupling point coupled to the one of the display supports.

8. The portable information handling system of claim 1 wherein the multi-axis hinge comprises five rotationally interfaced hinge elements.

9. A method for managing portable information handling system flexible display folding, the method comprising:
   rotating first and second housing portions about a multi-axis hinge from a flat orientation to a folded orientation;
   translating rotation of an axle of the multi-axis hinge to a sliding support disposed under the flexible display; and
   coordinating a lateral position of the sliding support relative to the multi-axis hinge and folding display with the translating;
   wherein coordinating a lateral position further comprises:
   extending the sliding support away from the multi-axis hinge during rotating from the flat orientation to the folded orientation; and
   retracting the sliding support towards the multi-axis hinge during rotating from the folded orientation to the flat orientation;

wherein the flexible display is supported by the sliding support on an inner circumference of the folded orientation; and wherein extending the sliding support away from the hinge during rotating from the flat orientation to the folded orientation further comprises:

rotating an axle of the multi-axis hinge;

engaging threads of the axle with threads of a bracket to slide the bracket parallel with the axle, threads of the bracket disposed on an inner circumference of an opening that inserts onto the axle;

translating the bracket movement to a first arm having a fixed position relative to the multi-axis hinge to rotate about the fixed position; and translating rotation of the first arm to a second arm from the fixed position, the second arm extending substantially perpendicular to the first arm and terminating at a coupling with the sliding support.

10. The method of claim 9 wherein coordinating a lateral position further comprises:

retracting the sliding support towards the multi-axis hinge during rotating from the flat orientation to the folded orientation; and extending the sliding support away from the multi-axis hinge during rotating from the folded orientation to the flat orientation;

wherein the flexible display is supported by the sliding support on an outer circumference of the folded orientation.

11. The method of claim 9 further comprising:

interfacing a spring with the axle and bracket; and biasing the sliding support with the spring to extend away from the multi-axis hinge.

12. The method of claim 9 wherein the flexible display comprises a plastic substrate organic light emitting diode display.

13. The method of claim 12 wherein the multi-axis hinge comprises five rotationally interfaced hinge elements.

14. A flexible display support comprising:

a multi-axis hinge operable to rotate between flat and folded orientations;

first and second hinge mounts fixedly coupled at opposing ends of the multi-axis hinge;

first and second axles extending from the multi-axis hinge, the first axle proximate the first hinge mount, the second axle proximate the second hinge mount, the first and second axles rotating as the hinge transitions between flat and folded orientations, each of the first and second axles having threads;

first and second threaded brackets, each of the first and second threaded brackets having an opening with a threaded inner circumference, the first threaded bracket opening inserted over the first axle to engage the inner circumference threads with the first axle threads, the second threaded bracket opening inserted over the second axle to engage the inner circumference threads with the second axles threads, first and second sliding supports, the first sliding support coupled in a sliding relationship with the first hinge mount, the second sliding support coupled in a sliding relationship with the second hinge mount; and first and second linkages, the first linkage coupled to the first axle thread by the first threaded bracket and to the first sliding support around a first pivot fixed to the first hinge mount, the second linkage coupled to the second axle thread by the second threaded bracket and to the second sliding support around a second pivot fixed to the second hinge mount;

wherein rotation of the first and second axles move the first and second threaded brackets along the axles to cooperate with the first and second linkages to move the sliding supports relative to the multi-axis hinge in coordination with a flexible display disposed on the sliding supports.

15. The flexible display support of claim 14 further comprising a flexible organic light emitting diode display disposed on the sliding supports.

16. The flexible display support of claim 14 further comprising first and second springs, the first spring coupled at the first axle to the first bracket, the second spring coupled at the second axle to the second bracket, the first and second springs biasing the first and sliding supports to extend away from the multi-axis hinge.

* * * * *